US005563547A

United States Patent [19]

Blanchard et al.

[11] Patent Number: 5,563,547
[45] Date of Patent: Oct. 8, 1996

[54] SINGLE SWITCH PTO ENABLER

[75] Inventors: Ronald L. Blanchard; Brian P. Marshall; Eric T. Swenson, all of Fort Wayne, Ind.; Riley A. Thomas, III, Oakbrook Terrace, Ill.

[73] Assignee: Navistar International Transportation, Chicago, Ill.

[21] Appl. No.: 395,391

[22] Filed: Feb. 21, 1995

[51] Int. Cl.$^6$ .............................. H03K 17/60; B60L 1/00
[52] U.S. Cl. ......................... 327/484; 327/576; 307/10.1; 123/319
[58] Field of Search ........................... 327/483, 484, 327/575, 576, 465; 307/10.1, 113; 192/3.58; 123/179.19, 2, 319

[56] References Cited

U.S. PATENT DOCUMENTS

| | | | |
|---|---|---|---|
| 3,149,293 | 9/1964 | Farkas | 327/484 |
| 3,317,819 | 5/1967 | Brodie | 327/309 |
| 3,593,270 | 7/1971 | Walker | 327/576 |
| 3,628,510 | 12/1971 | Moulds | 123/2 |
| 3,822,386 | 7/1974 | Grontowski, Jr. | 327/484 |
| 4,526,255 | 7/1985 | Hennessey et al. | 192/3.58 |
| 4,857,757 | 8/1989 | Sato et al. | 307/113 |

OTHER PUBLICATIONS

"T444E Product Training" Part Two, Manual No. TMT 2268, Navistar International Transportation Corp. Oct., 1993, pp. 1–21.
"Modern Electronic Circuits Reference Manual" McGraw–Hill, 1980, p. 961.

Primary Examiner—David C. Nelms
Assistant Examiner—Trong Phan
Attorney, Agent, or Firm—Dennis K. Sullivan

[57] ABSTRACT

An electronic circuit for providing a momentary switch closure function output in response to operation of a control-request switch input to a closed condition and maintenance of the control-request switch input in closed condition for an amount of time greater than the time of the momentary switch closure function output. One use of the invention is as a single switch PTO enabler in conjunction with an electronically controlled internal combustion engine to provide a required momentary switch closure input to the engine electronic control for enabling the engine speed to change to a demanded speed.

21 Claims, 1 Drawing Sheet 5,563,547

SINGLE SWITCH PTO ENABLER

FIELD OF THE INVENTION

This invention relates to electronic engine controls and to an electronic circuit for performing a momentary switch function that is utilized by those controls.

BACKGROUND AND SUMMARY OF THE INVENTION

Electronic engine controls comprise electronic circuitry, typically microprocessor based, that processes various inputs to provide the desired engine control functions. In one electronic engine control, a momentary switch input is required in order to allow engine speed to be changed. An engine-powered vehicle that has a PTO (power take-off) for allowing equipment other than the vehicle itself to be operated by the engine, requires an associated control for controlling engine operation, engine speed for example, when the PTO is in use. One type of control needs a momentary switch closure as one input for enabling a desired speed change to be performed. Heretofore, it was necessary to execute two switch operations in order to accomplish the momentary switch function and provide the desired speed change. The present invention is distinguished from the prior two switch activations by enabling single switch operation to perform the momentary switch function and provide the desired speed change.

The present invention relates to a new and unique electronic circuit for performing a momentary switch function that is suitable for accomplishing the aforementioned purpose. The invention provides: improved cost-effectiveness; greater operating convenience; and it eliminates a separate toggle switch that was required in a prior control in order to activate the PTO enabler. The invention enables an electronically controlled engine to operate equipment from the PTO in a manner similar to that previously used with mechanically controlled engines where a solenoid is linked to the pump rack of a diesel engine and controlled by a single switch.

The invention is further characterized by a unique organization and arrangement of standard electronic circuit components, and in a preferred embodiment these are four resistors, two transistors, a diode, and two capacitors. Four connections to external circuits are provided.

The closest prior art known to the inventors is a capacitor-coupled drive for switching transistors, an illustration of which appears at Page 961 of "Modern Electronic Circuits Reference Manual" by McGraw-Hill. The illustrated circuit is comparable in function to that of the present invention, but the circuit of the present invention requires fewer components, is less costly, and the prior circuit is not directly suited for the instant engine single switch PTO enabler application.

While the present invention relates in one respect to electronic engine controls where a momentary switch input is required, the electronic circuit embodied therein possesses utility for other applications, which may or may not necessarily be engine or vehicle related. One such other application is in a vehicle speed control system where the circuit can replace two switch actuation by single switch actuation.

The foregoing, along with further features, advantages, and benefits of the invention, will be seen in the ensuing description and claims, which are accompanied by a drawing. The drawing discloses a presently preferred embodiment of the invention according to the best mode contemplated at this time for carrying out the invention.

DESCRIPTION OF THE PREFERRED EMBODIMENT

Figure 1:
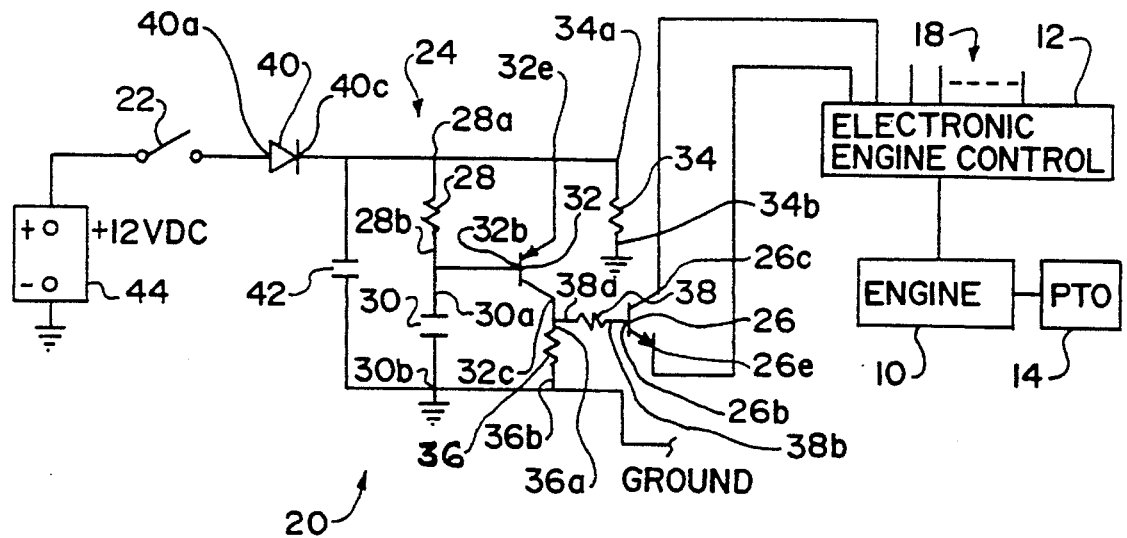
FIG. 1 is an electrical schematic circuit diagram of a single switch PTO enabler embodying principles of the invention.

FIG. 1 shows an exemplary application of the inventive principles to a vehicle, such as a heavy truck, that comprises an engine 10 that is controlled by an electronic engine control 12. Engine 10 is typically a diesel engine, but broader principles of the invention, as applied to an engine, are not limited to any particular application of the engine or type of engine. Engine 10 operates the vehicle through a powertrain that is not shown in the drawings; however, a PTO 14 is shown in association with engine 10 since the invention has arisen in connection with certain requirements of engine control 12 for enabling the operation of PTO 14.

PTO's per se are well known, and PTO 14 is a known commercially available device that has mechanical controls, such as a clutch (not shown) which connects the engine 10 to the PTO for operation.

Engine control 12 receives a number of inputs, shown generally at 18, processes the information received at these inputs, and issues appropriate commands for controlling engine 10. Details of how engine 10 is controlled by control 12 generally do not relate to the principles of the invention, except to the extent that one of the inputs to control 12 for enabling operation of the engine in response to the load imposed through the PTO 14 requires a momentary switch closure function. This is because the particular control strategy for the engine requires such an input in order to change the engine speed demanded for proper operation of the PTO driven device (not shown). With this background, attention can now be directed to the single switch PTO enabler, designated generally by the reference 20, in FIG. 1.

Single switch PTO enabler 20 may be considered to comprise: an engine control-request switch 22 providing an input command signal; and a timing circuit 24 that acts on the input command signal to control the conductivity of a main electronic switch 26 that provides the momentary switch closure to engine control 12. Timing circuit 24 may be considered to comprise: a series RC circuit composed of a resistor 28 and a capacitor 30 connected in series; a PNP transistor 32; and a resistor network composed of three resistors 34, 36, 38. Additional components are a diode 40 and a capacitor 42.

Resistor 28 has first and second terminals 28a, 28b; capacitor 30 has first and second terminals 30a, 30b; transistor 32 has base, emitter, and collector terminals 32b, 32e, and 32c respectively; and diode 40 has anode and cathode terminals 40a, 40c.

Control-request switch 22 serves to selectively connect a DC voltage 44 to timing circuit 24. The drawing shows a negative ground configuration so that it is the positive terminal of the DC voltage that is connected to one pole of control-request switch 22. The other pole of control-request switch 22 is connected to anode terminal 40a of diode 40, while the diode's cathode terminal 40c is connected to terminal 28a of resistor 28.

Resistor 28 and capacitor 30 form a series RC circuit by virtue of terminals 28b and 30a being connected in common and terminal 30b being connected to ground. Emitter terminal 32e of transistor 32 is connected in common with terminals 40c and 28a, while base terminal 32b is connected in common with terminals 28b and 30a.

Resistor 34 has terminals 34a, 34b; resistor 36 has terminals 36a, 36b; and resistor 38 has terminals 38a, 38b. Resistor terminal 34a is connected in common with terminals 32e, 28a, and 40c, while terminal 34b is connected to ground. Main electronic switch 26 is an NPN transistor comprising base, emitter, and collector terminals 26b, 26e, and 26c respectively. Terminals 32c, 36a, and 38a are connected in common. Terminal 36b is connected to ground, and terminal 38b is connected to terminal 26b. Terminals 26e and 26c are connected to respective terminals of engine control 12.

Figure 2A:
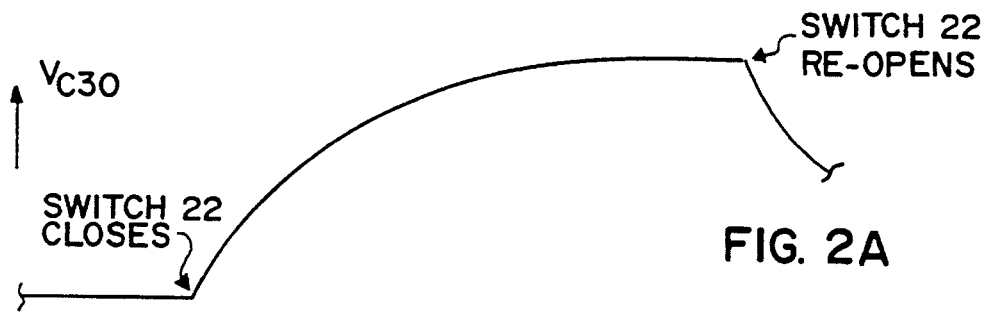
FIGS. 2A and 2B are voltage waveforms useful in understanding the operation of the circuit shown in FIG. 1.
Figure 2B:
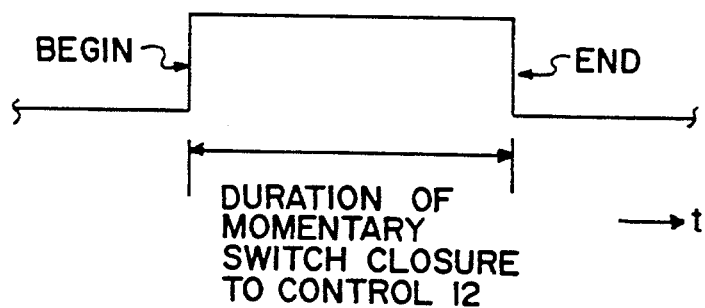

The circuit operates in the following manner. With control-request switch 22 open, no voltage is applied to timing circuit 24; consequently transistor 26 cannot be forward biased to a conductive state and so it remains non-conductive. When control-request switch 22 is operated from open to closed, the DC voltage 44 is applied. Since capacitor 30 is initially uncharged, the closure of switch 22 causes current to flow through diode 40 and resistor 28 to begin charging capacitor 30. Concurrent with this action, transistor 32 becomes forward biased into conduction so that its emitter-collector path carries current to both resistors 36 and 38. The current flow through resistor 38 to the base of transistor 26 forward biases that transistor so that the principal conduction path through its collector-emitter becomes conductive. FIG. 2B depicts this switching on a non-dimensional scale, and it is this switching that represents the beginning of a momentary switch closure to engine control 12.

The series RC circuit 28,30 executes an exponential transient with the voltage across capacitor becoming increasingly positive. This is depicted in FIG. 2A. After a certain portion of the transient has been executed, the voltage at base terminal 32b of transistor 32 reaches a magnitude that switches the transistor's emitter-collector path from conduction back to non-conduction. When this happens, the base-emitter junction of transistor 26 ceases to have the forward bias necessary to maintain the collector-emitter path through the transistor conductive. This represents the termination of the momentary switch closure and is also depicted in FIG. 2B.

When switch 22 is re-opened, capacitor 30 begins to discharge through resistors 28 and 34. The current flow through resistor 28 reverse biases the base-emitter junction of transistor 32 so that it is maintained non-conductive. Eventually capacitor 30 is fully discharged so that the circuit assumes its initial condition that existed before control-request switch 22 was first closed.

It is to be noted that control-request switch 22 must remain closed for at least as long as the required momentary switch closure time, and in fact can remain closed for an indefinite amount of time thereafter before being reopened. So long as switch 22 remains closed for at least the minimum amount of time required for completion of the momentary switch function, the total amount of time that switch 22 remains closed does is not significant.

The purpose of capacitor 42 is essentially a noise filter, while diode 40 blocks reverse current flow from timing circuit 24 back to the DC voltage supply.

While the present disclosure of the inventive principles enables the skilled person to utilize conventional circuit design principles to fabricate different designs for satisfying various timing needs, the following components have been utilized in the disclosed embodiment.

Transistor 26: 2N2222A

Resistor 28: 10 kilOhms

Capacitor 30: 47 microfarads

Transistor 32: 2N4403

Resistor 34: 1.2 kilOhms

Resistor 36: 3.3 megOhms

Resistor 38: 100 Ohms

Diode 40: 1N4007

Capacitor 42: 0.1 microfarad

While a presently preferred embodiment of the invention has been illustrated and described, it is to be appreciated that the principles may be practiced in other equivalent ways within the scope of the following claims.

What is claimed is:

1. In an internal combustion engine comprising an electronic engine control for controlling various operational functions of the engine wherein one operational function requires a momentary switch function and comprises momentary switch means for performing that one operational function, the improvement in said momentary switch means which comprises:

A) a main electronic switch having a principal conduction path and a control input for rendering said principal conduction path selectively operable to a first conductivity condition and to a second conductivity condition different from such first conductivity condition for enabling said main electronic switch to provide such momentary switch function;

B) a control request switch that is selectively operable to first and second switch conditions, and when operated from such first switch condition to such second switch condition, is effective to cause said principal conduction path of said main electronic switch to momentarily operate from one of its two different conductivity conditions to the other of its two different conductivity conditions and thereby perform such momentary switch function while said control request switch is maintained in such second switch condition; and C) an electronic timing circuit for operatively coupling said control request switch with said main electronic switch, said electronic timing circuit comprising, 1) a series RC circuit across which said control request switch is effective to connect a DC voltage when said control request switch is operated to its second switch condition, said series RC circuit executing an electrical transient when such DC voltage is so connected and comprising timing capacitor means that is charged during such transient;

2) a further electronic switch having a principal conduction path and a control input for rendering its principal conduction path selectively operable to two different conductivity conditions, 3) means electrically associating said control request switch, said further electronic switch and said series RC circuit comprising a) means connecting said control input of said further electronic switch with a portion of said series RC circuit for causing the electrical transient to be applied to said control input of said further electronic switch and cause said principal conduction path of said further electronic switch to execute a single cycle of momentarily switching from one of its two different conductivity conditions to the other during a portion of such electrical transient and at the conclusion of such portion of such electrical transient returning to such one conductivity condition and remaining in such one conductivity, condition irrespective of the amount of time for which said control request switch remains in its second switch condition, and b) means for discharging said timing capacitor means when said control request switch is returned from its second switch condition to its first switch condition; and 4) resistor means operatively connecting said principal conduction path of said further electronic switch with said control input of said main electronic switch for causing said principal conduction path of said main electronic switch to also execute a single cycle of momentarily operating from its first conductivity condition to its second conductivity condition during such portion of such electrical transient and at the conclusion of such portion of such electrical transient returning to its first conductivity condition and remaining in such first conductivity condition as long as said further electronic switch remains in its one conductivity condition.

2. The improvement set forth in claim 1 in which said series RC circuit comprises timing resistor means, and said means connecting said control input of said further electronic switch with a portion of said series RC circuit comprises means connecting said control input of said further electronic switch to receive voltage that appears across said timing resistor means.

3. The improvement set forth in claim 2 in which said further electronic switch comprises a PNP transistor having base, emitter, and collector terminals, and said timing resistor means has a first terminal that is connected in common said emitter terminal and a second terminal that is connected in common with said base terminal.

4. The improvement set forth in claim 3 further including a diode having an anode terminal and a cathode terminal, and in which said first terminal of said timing resistor means and said emitter terminal of said transistor are connected in common with said cathode terminal of said diode, and in which said anode terminal of said diode is operatively connected with said control-request switch.

5. The improvement set forth in claim 3 in which said timing capacitor means has first and second terminals, said resistor means comprises a first resistance having first and second terminals, said first terminal of said timing capacitor means is connected in common with both said second terminal of said timing resistance means and said base terminal of said transistor, said second terminal of said timing capacitor means is connected in common with said first terminal of said first resistance, and said means for discharging said timing capacitor means when said control request switch is returned to its first switch condition comprises a second resistance having first and second terminals, said second terminal of said first resistance is connected in common with said collector terminal of said transistor, said first terminal of said second resistance is connected in common with both said emitter terminal of said transistor and said first terminal of said timing resistor means, and said second terminal of said second resistance is connected in common with both said second terminal of said capacitor means and said first terminal of said first resistance.

6. The improvement set forth in claim 5 in which said main electronic switch comprises an NPN transistor having base, emitter, and collector terminals, said resistor means further comprises a third resistance having first and second terminals, said first terminal of said third resistance is connected in common with said second terminal of said first resistance and said collector terminal of said PNP transistor, and said second terminal of said third resistance is connected in common with said base terminal of said NPN transistor.

7. The improvement set forth in claim 1 in which said series RC circuit comprises timing resistor means, and said means connecting said control input of said further electronic switch with a portion of said series RC circuit comprises means connecting said control input of said further electronic switch across one of said timing resistor means and said timing capacitor means.

8. The improvement set forth in claim 7 in which said means connecting said control input of said further electronic switch across one of said timing resistor means and said timing capacitor means connects said control input of said further electronic switch across said timing resistor means, said timing resistor means and said further electronic switch each comprises a respective terminal, said respective terminals are connected in common, and including a circuit connection from said terminals to said control-request switch.

9. The improvement set forth in claim 8 in which said circuit connection from said terminals to said control-request switch comprises diode means poled such that in its forward conduction state, current flow from such DC voltage to said series RC circuit and to said further electronic switch passes through said diode means.

10. The improvement set forth in claim 9 in which said timing resistor means comprises a further terminal, said timing capacitor means comprises a pair of terminals, one of which is connected in common with said further terminal of said timing resistor means, said means for discharging said timing capacitor means when said control request switch is returned to its first switch condition comprises a resistance having a pair of terminals, one of which is connected in common with said respective terminals of said timing resistor means and said further electronic switch that are connected in common, and the other of which is connected in common with the other terminal of said timing capacitor means.

11. A momentary switch circuit for performing a momentary switch function in response to operation of a control request switch from a first switch condition to a second switch condition and the continued maintenance of the control request switch in the second switch condition, such operation causing a DC voltage to be supplied to the momentary switch circuit, said momentary switch circuit comprising in combination with said control request switch:

A) a main electronic switch having a principal conduction path and a control input for rendering said principal conduction path selectively operable to a first conductivity condition and to a second conductivity condition different from such first conductivity condition for enabling said main electronic switch to provide such momentary switch function;

B) a series RC circuit across which the DC voltage is applied when said control request switch is operated to its second switch condition, said series RC circuit executing an electrical transient when the DC voltage is so applied and comprising timing capacitor means that is charged during such transient;

C) a further electronic switch having a principal conduction path and a control input for rendering its principal conduction path selectively operable to two different conductivity conditions;

D) means electrically associating said control request switch, said further electronic switch and said series RC circuit comprising a) means connecting said control input of said further electronic switch with a portion of said series RC circuit for causing the electrical transient to be applied to said control input of said further electronic switch and cause said principal conduction path of said further electronic switch to execute a single cycle of momentarily switching from one of its two different conductivity conditions to the other during a portion of such electrical transient and at the conclusion of such portion of such electrical transient returning to such one conductivity condition and remaining in such one conductivity condition irrespective of the amount of time for which said control request switch remains in its second switch condition, and b) means for discharging said timing capacitor means when said control request switch is returned from its second switch condition to its first switch condition; and E) resistor means operatively connecting said principal conduction path of said further electronic switch with said control input of said main electronic switch for causing said principal conduction path of said main electronic switch to also execute a single cycle of momentarily operating from its first conductivity condition to its second conductivity condition during such portion of such electrical transient and at the conclusion of such portion of such electrical transient returning to its first conductivity condition and remaining in such first conductivity condition as long as said further electronic switch remains in its one conductivity condition.

12. A momentary switch circuit as set forth in claim 11 in which said series RC circuit comprises timing resistor means, and said means connecting said control input of said further electronic switch with a portion of said series RC circuit comprises means connecting said control input of said further electronic switch to receive voltage that appears across said timing resistor means.

13. A momentary switch circuit as set forth in claim 12 in which said further electronic switch comprises a PNP transistor having base, emitter, and collector terminals, and said timing resistor means has a first terminal that is connected in common said emitter terminal and a second terminal that is connected in common with said base terminal.

14. A momentary switch circuit as set forth in claim 13 further including a diode having an anode terminal and a cathode terminal, and in which said first terminal of said timing resistor means and said emitter terminal of said transistor are connected in common with said cathode terminal of said diode, and in which said anode terminal of said diode is operatively connected with said control request switch.

15. A momentary switch circuit as set forth in claim 13 in which said timing capacitor means has first and second terminals, said resistor means comprises a first resistance having first and second terminals, said first terminal of said timing capacitor means is connected in common with both said second terminal of said timing resistance means and said base terminal of said transistor, said second terminal of said timing capacitor means is connected in common with said first terminal of said first resistance, and said means for discharging said timing capacitor means when said control request switch is returned to its first condition comprises a second resistance having first and second terminals, said second terminal of said first resistance is connected in common with said collector terminal of said transistor, said first terminal of said second resistance is connected in common with both said emitter terminal of said transistor and said first terminal of said timing resistor means, and said second terminal of said second resistance is connected in common with both said second terminal of said capacitor means and said first terminal of said first resistance.

16. A momentary switch circuit as set forth in claim 15 in which said main electronic switch comprises an NPN transistor having base, emitter, and collector terminals, said resistor means further comprises a third resistance having first and second terminals, said first terminal of said third resistance is connected in common with said second terminal of said first resistance and said collector terminal of said PNP transistor, and said second terminal of said third resistance is connected in common with said base terminal of said NPN transistor.

17. A momentary switch circuit as set forth in claim 11 in which said series RC circuit comprises timing resistor means and timing capacitor means, and said means connecting said control input of said further electronic switch with a portion of said series RC circuit comprises means connecting said control input of said further electronic switch across one of said timing resistor means and said timing capacitor means.

18. A momentary switch circuit as set forth in claim 17 in which said means connecting said control input of said further electronic switch across one of said timing resistor means and said timing capacitor means connects said control input of said further electronic switch across said timing resistor means, said timing resistor means and said further electronic switch each comprises a respective terminal, said respective terminals are connected in common, and including a circuit connection from said terminals to said control request switch.

19. A momentary switch circuit as set forth in claim 18 in which said circuit connection from said terminals to said control request switch comprises diode means poled such that in its forward conduction state, current flow from such DC voltage to said series RC circuit and to said further electronic switch passes through said diode means.

20. A momentary switch circuit as set forth in claim 19 in which said timing resistor means comprises a further terminal, said timing capacitor means comprises a pair of terminals, one of which is connected in common with said further terminal of said timing resistor means, said means for discharging said timing capacitor means when said control request switch is returned to its first switch condition comprises a resistance having a pair of terminals, one of which is connected in common with said respective terminals of said timing resistor means and said further electronic switch that are connected in common, and the other of which is connected in common with the other terminal of said timing capacitor means.

21. A momentary switch circuit as set forth in claim 11 in which said first conductivity condition of said main electronic switch is one of non-conduction, and said second conductivity condition of said main electronic switch is one of conduction.

\* \* \* \* \*